(12) United States Patent
Hwang

(10) Patent No.: US 12,740,289 B2
(45) Date of Patent: Sep. 15, 2026

(54) DISPLAY DEVICE

(71) Applicant: LG Display Co., Ltd., Seoul (KR)

(72) Inventor: Jihyeon Hwang, Incheon (KR)

(73) Assignee: LG Display Co., Ltd., Seoul (KR)

( * ) Notice: Subject to any disclaimer, the term of this patent is extended or adjusted under 35 U.S.C. 154(b) by 156 days.

(21) Appl. No.: 18/932,254

(22) Filed: Oct. 30, 2024

(65) Prior Publication Data

US 2025/0268063 A1 Aug. 21, 2025

(30) Foreign Application Priority Data

Feb. 20, 2024 (KR) ........................ 10-2024-0024321

(51) Int. Cl.
*H10K 59/80* (2023.01)
*H10K 59/65* (2023.01)

(52) U.S. Cl.
CPC ......... *H10K 59/8722* (2023.02); *H10K 59/65* (2023.02); *H10K 59/8721* (2023.02)

(58) Field of Classification Search
CPC ........ H10K 59/871–8731; H10K 59/65; G06F 1/605; H04M 1/0264
See application file for complete search history.

(56) References Cited

U.S. PATENT DOCUMENTS

2023/0217784 A1* 7/2023 Yu .......................... H10K 59/65 257/40
2025/0228112 A1* 7/2025 Byun ................ H10K 59/8791

FOREIGN PATENT DOCUMENTS

CN 117062490 A * 11/2023 ............ H10W 42/60
CN 117935677 A * 4/2024 ......... H10K 59/8722
KR 10-2022-0034947 A 3/2022

* cited by examiner

*Primary Examiner* — Mariceli Santiago
(74) *Attorney, Agent, or Firm* — Seed Intellectual Property Law Group LLP

(57) ABSTRACT

According to an aspect of the present disclosure, a display device includes a cover window; a display panel which is disposed below the cover window and includes a display area in which a plurality of sub pixels is disposed and an optical area which is disposed between the plurality of sub pixels in the display area and has a through-hole disposed therein; an adhesive layer which is disposed below the display panel and includes a first adhesive unit which is disposed to enclose the through-hole and has a conductivity and a second adhesive unit which encloses the first adhesive unit; and a metal plate disposed below the adhesive layer.

20 Claims, 7 Drawing Sheets

DISPLAY DEVICE

CROSS-REFERENCE TO RELATED APPLICATIONS

This application claims the priority and benefits of Korean Patent Application No. 10-2024-0024321 filed on Feb. 20, 2024, in the Korean Intellectual Property Office, the disclosure of which is incorporated herein by reference in its entirety for all purposes, as if fully set forth herein.

BACKGROUND

Technical Field

The present disclosure relates to a display device, and more particularly, for example, without limitation, to a display device with an improved reliability.

Description of the Related Art

Currently, as it enters a full-scale information era, a field of a display device which visually expresses electrical information signals has been rapidly developed and studies are continued to improve performances of various display devices such as a thin-thickness, a light weight, and low power consumption.

Among various display devices, a light emitting display device is a self-emitting display device so that a separate light source is not necessary, which is different from the liquid crystal display device. Therefore, the light emitting display device may be manufactured to have light weight and small thickness. Further, since the light emitting display device is driven at a low voltage so that it is advantageous not only in terms of power consumption, but also in terms of color implementation, a response speed, a viewing angle, and a contrast ratio (CR). Therefore, it is expected to be utilized in various fields.

The description provided in the background section should not be assumed to be prior art merely because it is mentioned in or associated with the background section. The background section may include information that describes one or more aspects of the subject technology.

BRIEF SUMMARY

An object to be achieved by the present disclosure is to provide a low-power display device with an improved reliability and a long lifespan.

Another object to be achieved by the present disclosure is to provide a display device which minimizes a bezel size of an optical area disposed in a display area.

Objects of the present disclosure are not limited to the above-mentioned objects, and other objects, which are not mentioned above, can be clearly understood by those skilled in the art from the following descriptions.

According to an aspect of the present disclosure, a display device includes a cover window; a display panel which is disposed below the cover window and includes a display area in which a plurality of sub pixels is disposed and an optical area which is disposed between the plurality of sub pixels in the display area and has a through-hole disposed therein; an adhesive layer which is disposed below the display panel and includes a first adhesive unit which is disposed to enclose the through-hole and has a conductivity and a second adhesive unit which encloses the first adhesive unit; and a metal plate disposed below the adhesive layer.

Other detailed matters of the exemplary embodiments are included in the detailed description and the drawings.

An effect according to the present disclosure is to improve the reliability of the display device by minimizing the concentration of a current on a through-hole of an optical area disposed in the display area.

An effect according to the present disclosure is to minimize the bezel size of the optical area by placing a configuration for inducing a current at the outside of the through-hole.

The effects according to the present disclosure are not limited to the contents exemplified above, and more various effects are included in the present specification.

It is to be understood that both the foregoing general description and the following detailed description are exemplary and explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

The above and other aspects, features and other advantages of the present disclosure will be more clearly understood from the following detailed description taken in conjunction with the accompanying drawings, in which.

Figure 1:
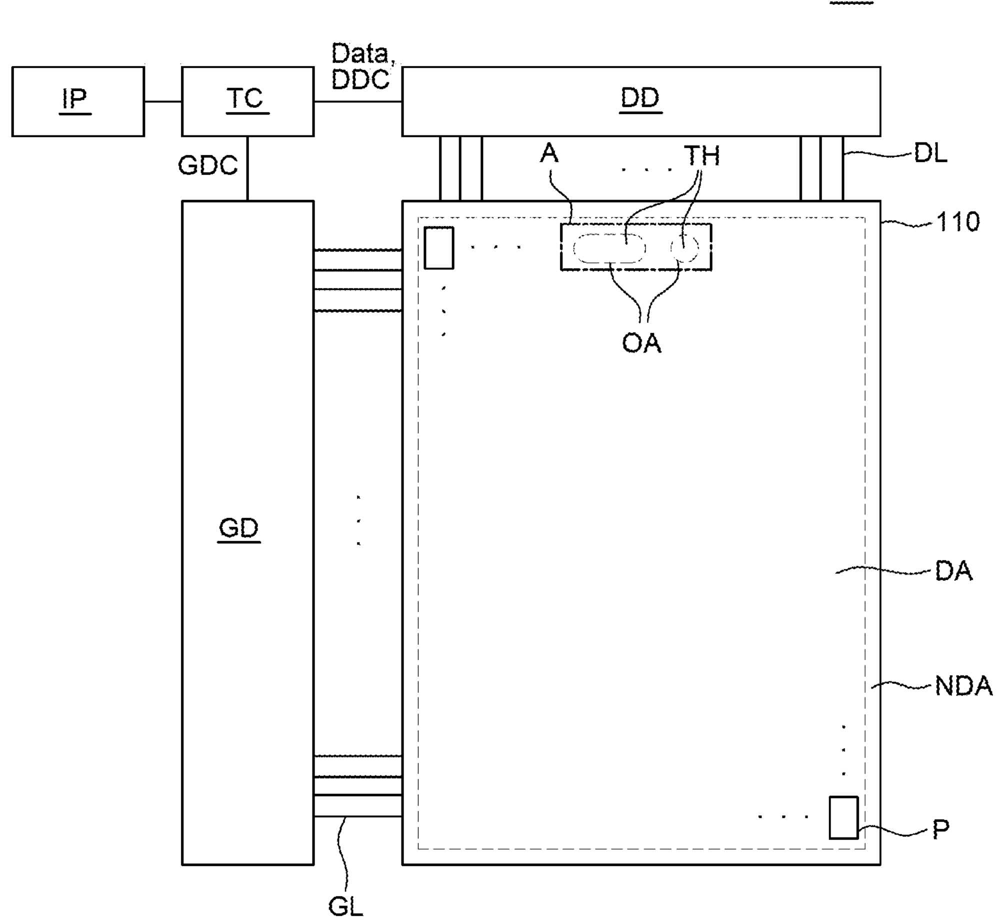
FIG. 1 is a block diagram of a display device according to an exemplary embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. The progression of processing steps and/or operations described is an example; however, the sequence of steps and/or operations is not limited to that set forth herein and may be changed as is known in the art, with the exception of steps and/or operations necessarily occurring in a particular order. Names of the respective elements used in the following explanations may be selected only for convenience of writing the specification and may be thus different from those used in actual products.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as 'including,' 'having,' 'consist of' used herein are generally intended to allow other components to be added unless the terms are used with the term 'only.' Any references to singular may include plural unless expressly stated otherwise.

The word "exemplary" is used to mean serving as an example or illustration. Aspects are example aspects. "Embodiments," "examples," "aspects," and the like should not be construed as preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

Components are interpreted to include an ordinary error range even if not expressly stated. Any implementation described herein as an "example" is not necessarily to be construed as preferred or advantageous over other implementations.

When the position relation between two parts is described using the terms such as 'on,' 'above,' 'below,' 'next,' one or more parts may be positioned between the two parts unless the terms are used with the term 'immediately' or 'directly.'

When an element or layer is disposed "on" another element or layer, another layer or another element may be interposed directly on the other element or therebetween. The terms, such as "below," "lower," "above," "upper" and the like, may be used herein to describe a relationship between element(s) as illustrated in the drawings. It will be understood that the terms are spatially relative and based on the orientation depicted in the drawings.

Although the terms "first," "second," "A," "B," "(a)," and "(b)," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification. The term "at least one" should be understood as including any and all combinations of one or more of the associated listed items. For example, the meaning of "at least one of a first element, a second element, and a third element" compasses the combination of all three listed elements, combinations of any two of the three elements, as well as each individual element, the first element, the second element, or the third element.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, various exemplary embodiments of the present disclosure will be described in detail with reference to accompanying drawings.

FIG. 1 is a block diagram of a display device according to an exemplary embodiment of the present disclosure.

Referring to FIG. 1, a display device 100 according to an exemplary embodiment of the present disclosure may include an image processor IP, a timing controller TC, a data driver DD, a gate driver GD, and a display panel 110.

At this time, the image processor IP may output a data signal and a data enable signal supplied from the outside. The image processor IP may output one or more of a vertical synchronization signal, a horizontal synchronization signal, and a clock signal, etc., in addition to the data enable signal.

The timing controller TC is supplied with the data signal together with the data enable signal or a driving signal including the vertical synchronization signal, the horizontal synchronization signal, and the clock signal, from the image processor IP. The timing controller TC may output a gate timing control signal GDC for controlling an operation timing of the gate driver GD and a data timing control signal DDC for controlling an operation timing of the data driver DD and a data signal Data, based on the driving signal.

Further, the data driver DD samples and latches the data signal Data supplied from the timing controller TC in response to the data timing control signal DDC supplied from the timing controller TC to convert the data signal into a gamma reference voltage and output the converted gamma reference voltage. The data driver DD may output the data signal through a plurality of data lines DL.

Further, the gate driver GD may output the gate signal while shifting a level of the gate voltage, in response to the gate timing control signal GDC supplied from the timing controller TC. The gate driver GD may output the gate signal through a plurality of gate lines GL.

The display panel 110 may display images while a pixel P emits light in response to the data signal and the gate signal supplied from the data driver DD and the gate driver GD.

The display panel 110 may include a display area DA and a non-display area NDA which extends from the display area DA. As an example, the non-display area NDA may fully or partially enclose the display area DA.

The display area DA is an area where images are displayed in the display panel 110.

In the display area DA, a plurality of pixels P and a circuit for driving the plurality of pixels P may be disposed. The plurality of pixels P is a minimum unit which configures the display area DA and a display element may be disposed in each of the plurality of pixels P. For example, an organic light emitting diode which includes an anode, an emission layer, and a cathode may be disposed in each of the plurality of pixels P, but it is not limited thereto. As an example, a light emitting diode, a micro light emitting diode, etc., may be disposed in each of the plurality of pixels P, without being limited thereto. Further, a circuit for driving the plurality of pixels P may include a driving element, a wiring line, and the like. For example, the circuit may be configured by a thin film transistor, a storage capacitor, a gate line, a data line, and the like, but is not limited thereto.

The optical area OA is an area which is disposed in the display area DA and has a through-hole TH disposed therein. In the display panel 110, the through-hole TH is disposed in the display area DA to reduce or minimize a bezel area which is a non-display area NDA and may maximize or increase the display area DA. A product with a design which increases or maximizes the display area DA may be aesthetically preferable by increasing or maximizing the user's screen immersion.

As an example, the through-hole TH may be formed so as to correspond to a sensor, for example, an optical electronic device, such as camera or an optical sensor, without being limited thereto.

As illustrated in FIG. 1, two through-holes TH may be provided, but are not limited thereto and through-holes may be disposed in various forms. For example, one or two holes are disposed in the display area DA so that a camera is disposed in a first hole and a distance sensing sensor or a face recognition sensor, and a wide-angle camera may be disposed in a second hole. For example, one hole or three or more holes may be disposed in the display area DA. Although it is illustrated that the two through-holes TH are disposed together in an area A, embodiments are not limited thereto. As an example, the two through-holes TH or more than two through-holes may be disposed at various separate locations, respectively in the display area DA or even in the non-display area NDA.

The non-display area NDA is an area where no image is displayed.

As an example, the non-display area NDA may be bent so as not to be seen from a front surface or blocked by a case which configures an outer periphery of the display device and is also referred to as a bezel area, without being limited thereto. As an example, at least a portion of the non-display area NDA may be bent toward a rear side of the display panel 110. As an example, the non-display area NDA may be not bent.

Even though in FIG. 1, it is illustrated that the non-display area NDA encloses a quadrangular display area DA, shapes and placements of the display area DA and the non-display area NDA are not limited to the example illustrated in FIG. 1. As an example, the display area DA and the non-display area NDA may have shapes suitable for a design of an electronic device including the display device 100. For example, an exemplary shape of the display area DA may be a pentagon, a hexagon, a circle, an oval, or the like.

In the non-display area NDA, various wiring lines, circuits, and the like for driving the organic light emitting diode of the display area DA may be disposed. For example, in the non-display area NDA, a link line which transmits signals to the plurality of sub pixels and circuits of the display area DA, a gate-in-panel (GIP) line, or a driving IC, such as a gate driver GD or a data driver DD, may be disposed, but it is not limited thereto.

The display device 100 may further include various additional elements to generate various signals or drive the pixel in the display area DA. The additional elements for driving the pixels may include an inverter circuit, a multiplexer, an electrostatic discharge (ESD) circuit, or the like, without being limited thereto. The display device 100 may further include an additional element associated with a function other than a function of driving a pixel. For example, the display device 100 may further include additional elements which provide a touch sensing function, a user authentication function (for example, fingerprint recognition), a multilevel pressure sensing function, or a tactile feedback function, without being limited thereto. The above-mentioned additional elements may be located in the display area DA, the non-display area NDA and/or an external circuit which is connected to a connecting interface of the display area DA and/or the non-display area NDA.

Figure 2:
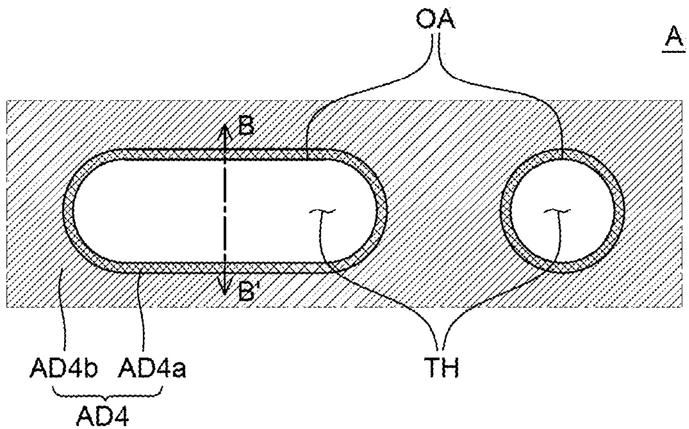
FIG. 2 is an enlarged plan view of an area A of FIG. 1.
Figure 3:
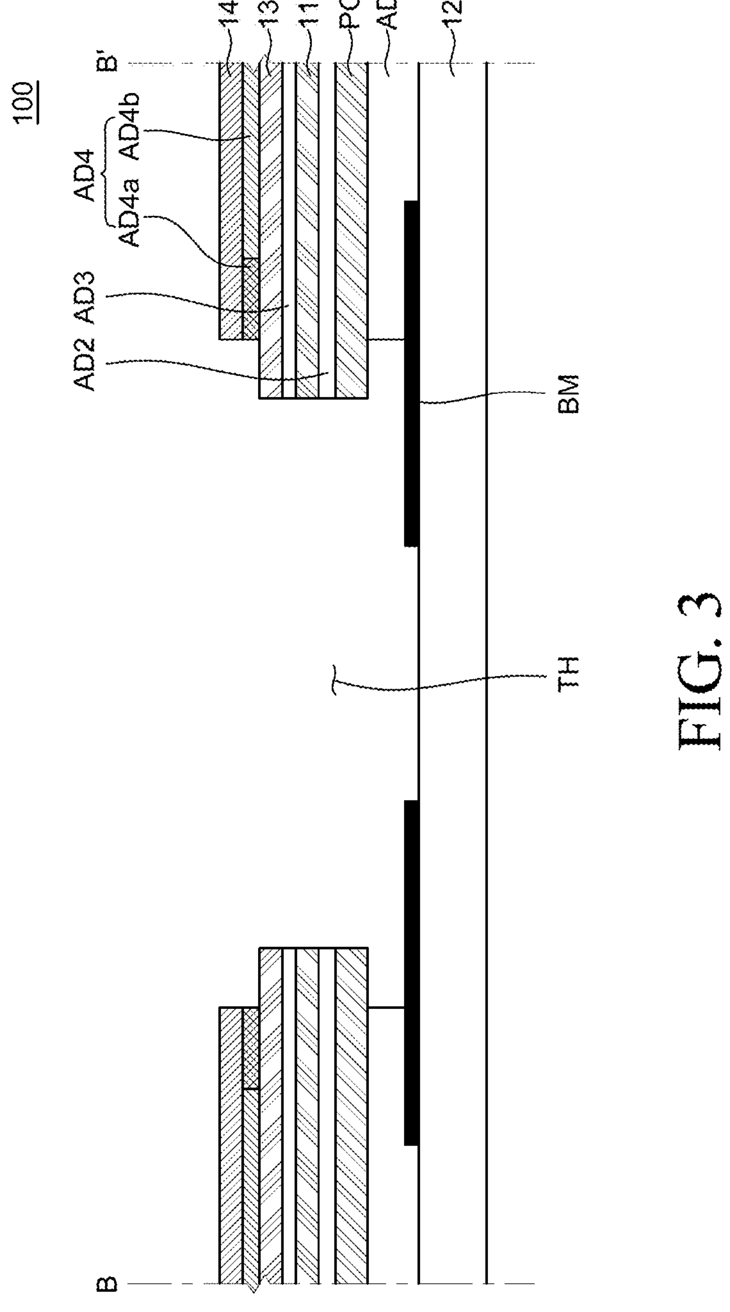
FIG. 3 is a cross-sectional view of B-B' of FIG. 2.

FIG. 2 is an enlarged plan view of an area A of FIG. 1. FIG. 3 is a cross-sectional view of B-B' of FIG. 2. FIGS. 2 and 3 are an enlarged plan view and a cross-sectional view for explaining an optical area OA of a display device according to an exemplary embodiment of the present disclosure. For the convenience of description, in FIG. 2, only a fourth adhesive layer AD4 is illustrated.

Referring to FIGS. 2 and 3, the display device 100 according to the present disclosure includes a display panel 110, a cover window 120, a back plate 130, a metal plate 140, a polarizer POL, a black matrix BM, a first adhesive layer AD1, a second adhesive layer AD2, a third adhesive layer AD3, and a fourth adhesive layer AD4. Embodiments are not limited thereto. As an example, at least one of the above-mentioned components could be omitted depending on the design. As an example, one or more additional components may be additionally or alternatively included.

Referring to FIGS. 2 and 3, a through-hole TH is disposed in the optical area OA. The through-hole TH may form a space for placing a sensor, for example, an optical electronic device, such as a camera or an optical sensor, in the display area DA. The through-hole TH may expose a side surface of the display panel 110, a side surface of the back plate 130, a side surface of the metal plate 140, a side surface of the polarizer POL, a side surface of the first adhesive layer AD1, a side surface of the second adhesive layer AD2, a side surface of the third adhesive layer AD3, and a side surface of the fourth adhesive layer AD4, corresponding to the optical area OA, but is not limited thereto.

The display panel 110 is a panel for displaying images to a user. In the display panel 110, a display element which displays images, a driving element which drives the display element, and wiring lines which transmit various signals to the display element and the driving element may be disposed.

The display element may be defined in different manners depending on the type of the display panel 110. For example, when the display panel 110 is an organic light emitting display panel 110, the display element may be an organic light emitting diode which includes an anode, an organic emission layer, and a cathode. For example, when the display panel 110 is a liquid crystal display panel, the display element may be a liquid crystal display element. Hereinafter, even though the description will be made by assuming that the display panel 110 is an organic light emitting display panel, the display panel 110 is not limited to the organic light emitting display panel.

The display panel 110 may include a substrate, a pixel unit, an encapsulation layer, and the like.

The substrate is a base member which supports various components of the display panel 110 and may be configured by an insulating material. The substrate may be formed of a material having flexibility, such as a plastic material, without being limited thereto. For example, the substrate may be formed of a plastic material, such as polyimide (PI), polyethylene terephthalate(PET), polycarbonate(PC), acrylonitrile-butadiene-styrene copolymer(ABS), polymethyl methacrylate(PMMA), polyethylene naphthalate(PEN), etc., but is not limited thereto. As an example, the substrate may be formed of a rigid material such as glass, without bring limited thereto.

The pixel unit includes a plurality of organic light emitting diodes and a circuit for driving the organic light emitting diodes. The pixel unit may be disposed so as to correspond to the display area DA.

In the meantime, the display panel 110 may be configured by a top emission type, a bottom emission type, or a dual emission type, depending on an emission direction of light which is emitted from the organic light emitting diode.

According to the top emission type, light emitted from the organic light emitting diode is emitted to an upper portion of the substrate on which the organic light emitting diode is formed. In the case of the top emission type, as an example, a reflective layer may be formed below the anode to allow the light emitted from the organic light emitting diode to travel above the substrate, that is, toward the cathode, without being limited thereto. As an example, no reflective layer may be formed below the anode.

According to the bottom emission type, light emitted from the organic light emitting diode is emitted to a lower portion of the substrate on which the organic light emitting diode is formed. In the case of the bottom emission type, as an example, the anode may be formed only of a transparent conductive material and the cathode may be formed of the a material (e.g., a metal material) having a high reflectance to allow the light emitted from the organic light emitting diode to travel below the substrate, or may be formed of a material not having high reflectance, without being limited thereto.

Hereinafter, the description will be made by assuming that the display device 100 according to the exemplary embodiment of the present disclosure is a top emission type, but it is not limited thereto.

The encapsulation layer is disposed so as to cover the pixel unit. The encapsulation layer seals the organic light emitting diode of the pixel unit. The encapsulation layer may protect the organic light emitting diode of the pixel unit from moisture, oxygen, impact, or the like of the outside. The encapsulation layer may be formed by alternately laminating a plurality of inorganic layers and a plurality of organic layers, without being limited thereto. For example, the inorganic layer may be formed of an inorganic material such as silicon nitride (SiNx), silicon oxide (SiOx), and aluminum oxide (AlOx) and the organic layer may be formed of epoxy-based or acrylic-based polymer, but they are not limited thereto.

Referring to FIG. 3, the cover window 120 is disposed on the front surface of the display panel 110. The cover window 120 may be a component which is exposed to the outer periphery of the display device 100 and protect the display device 100 from external shock or scratches. Further, the cover window 120 may protect the display device 100 from moisture permeating from the outside. The cover window 120 may be formed of a glass or a plastic material having a flexibility, but is not limited thereto.

A black matrix BM is disposed below the cover window 120. The black matrix BM is disposed along an outer periphery of the optical area OA below the cover window 120. The black matrix BM may be formed of a material having a low transmissivity. Therefore, the black matrix BM may suppress various components disposed in the optical area OA from being visible to the outside. Further, as an example, the black matrix BM may be formed of a material having a conductivity to discharge static electricity of the cover window 120, or may be formed of a semiconductor material or an insulating material. In the meantime, as an example, the black matrix BM may be disposed along the circumference of the cover window 120 at the outer periphery of the cover window 120 corresponding to the outer periphery of the display panel 110, without being limited thereto. At this time, the area in which the black matrix BM is disposed may correspond to the first non-display area NDA, but is not limited thereto. As an example, the black matrix BM may be omitted from the outer periphery of the optical area OA or from the outer periphery of the cover window 120, depending on the design.

As an example, the black matrix BM may be configured by chrome (Cr), graphite, or resin including conductive particles, without being limited thereto. Here, the resin may be formed of one or more materials of acrylic resin, epoxy resin, phenolic resin, polyamides resin, polyimides resin, unsaturated polyesters resin, polyphenylene resin, polyphenylenesulfides resin, and benzocyclobutene, but is not limited thereto. Further, the conductive particle may also be formed of any one of molybdenum (Mo), chrome (Cr), titanium (Ti), nickel (Ni), neodymium (Nd), copper (Cu), and an alloy of silver (Ag) and magnesium (Mg), but is not limited thereto.

Referring to FIG. 3, the polarizer POL is disposed between the display panel 110 and the cover window 120. The polarizer POL may be disposed on the front surface of the display panel 110. The polarizer POL selectively transmits light to reduce the reflection of external light which is incident onto the display panel 110. Specifically, the display panel 110 includes various metal materials applied to the semiconductor element, the wiring line, and the organic light emitting diode. Therefore, the external light incident onto the display panel 110 may be reflected from the metal material so that the visibility of the display device 100 may be reduced due to the reflection of the external light. In contrast, when the polarizer POL is disposed, the polarizer POL suppress the reflection of the external light so that the outdoor visibility of the display device 100 may be increased. However, the polarizer POL may be omitted depending on an implementation example of the display device 100, but it is not limited thereto.

The first adhesive layer AD1 is disposed between the polarizer POL and the cover window 120 and the second adhesive layer AD2 is disposed between the polarizer POL and the display panel 110. The first adhesive layer AD1 may bond the cover window 120 and the polarizer POL and the second adhesive layer AD2 may bond the polarizer POL and the display panel 110. As a result, the first adhesive layer AD1 and the second adhesive layer AD2 may bond the display panel 110 and the cover window 120. The first adhesive layer AD1 and the second adhesive layer AD2 may be formed as transparent adhesive layers so that an image of the display panel 110 is visible. For example, the first adhesive layer AD1 and the second adhesive layer AD2 may be formed of optical clear adhesives (OCA), but are not limited thereto. As an example, at least one of the first adhesive layer AD1 and the second adhesive layer AD2 may be omitted depending on the design.

The back plate 130 is disposed below the display panel 110. The back plate 130 may be disposed so as to support the display panel 110. For example, when the substrate of the display panel 110 is formed of a flexible material (e.g., a plastic material such as polyimide), due to the flexible property, a separate component for protecting the substrate may be provided. Therefore, as an example, a support substrate which is formed of glass is disposed below the substrate to perform a manufacturing process of the display device 100 and the support substrate may be separated to be released after completing the manufacturing process. However, a component for supporting the substrate may be provided even after releasing the support substrate, so that a back plate 130 for supporting the substrate may be disposed below the display panel 110. Embodiments are not limited thereto. As an example, the back plate 130 may be omitted depending on the design.

The back plate 130 may include a plastic material. For example, the back plate 130 may be formed of a plastic thin film formed of polyimide (PI), polyethylene naphthalate (PEN), polyethylene terephthalate (PET), or a combination of the polymers. Embodiments are not limited thereto. As an example, the back plate 130 may include a rigid material or a flexible material. As an example, the back plate 130 may include a metal material, an inorganic material or an organic material, without being limited thereto.

The third adhesive layer AD3 is disposed between the display panel 110 and the back plate 130. The third adhesive layer AD3 may bond the display panel 110 and the back plate 130. The third adhesive layer AD3 may be formed of a pressure sensitive adhesive (PSA), but is not limited thereto.

The metal plate 140 may be disposed below the back plate 130. The metal plate 140 may protect the components of the display device 100 from external shocks. Further, as an example, the metal plate 140 serves as an earth to suppress the static electricity entering the display device 100 or easily discharge residual charges accumulated in the display device 100 to the outside. Further, the metal plate 140 easily discharges heat generated in the display device 100 to the outside. The metal plate 140 may be formed of a metal material having excellent thermal conductivity, electrical conductivity, and/or mechanical rigidity, without being limited thereto. For example, the metal plate 140 may be configured by copper (Cu) or stainless steel (SUS), but is not limited thereto. As an example, the metal plate 140 may be omitted depending on the design.

Even though it is not illustrated in the drawing, a frame may be disposed on a rear surface of the metal plate 140. The frame may seal and protect side surfaces and rear surfaces of the display panel 110, the back plate 130, and the metal plate 140. In the frame, various components for driving the components of the display device 100, for example, a controller, a camera, a battery, a sensor, an earth unit, or the like may be disposed. In the meantime, as an example, the frame, for example, may be configured to be electrically connected to the metal plate 140 through a cable or a wire to earth the metal plate 140, but is not limited thereto.

The fourth adhesive layer AD4 may be disposed between the back plate 130 and the metal plate 140. The fourth adhesive layer AD4 may bond the back plate 130 and the metal plate 140 to each other. The fourth adhesive layer AD4 may be formed of a pressure sensitive adhesive (PSA), but is not limited thereto.

Referring to FIGS. 2 and 3, as an example, the fourth adhesive layer AD4 includes a first adhesive unit AD4*a* (or first adhesive member AD4*a*) and a second adhesive unit AD4*b* (or second adhesive member AD4*b*).

The first adhesive unit AD4*a* is disposed in the fourth adhesive layer AD4 so as to fully or partially enclose the through-hole TH. As illustrated in FIG. 2, the first adhesive layer AD4*a* may be disposed so as to enclose the through-hole TH with a constant width in the plan view, without being limited thereto. As an example, the first adhesive layer AD4*a* may be disposed so as to enclose the through-hole TH with a varied width in the plan view.

As an example, the first adhesive unit AD4*a* has a conductivity. As an example, the first adhesive unit AD4*a* has a conductivity higher than that of the second adhesive unit AD4*b*. For example, the first adhesive unit AD4*a* is formed by adding a conductive material, such as a metal material, to an adhesive material, such as a PSA, but is not limited thereto. As an example, the first adhesive unit AD4*a* may be formed by adding a conductive material, such as a metal material, to an adhesive material, such as a PSA, while the second adhesive unit AD4*b* is formed of the same adhesive material, but it is not limited thereto. In the meantime, the first adhesive unit AD4*a* is designed to maintain an adhesive force even though a conductive material is added. Therefore, for example, the adhesive force of the first adhesive unit AD4*a* may be 18 N/25 mm or higher. As an example, the adhesive force of the first adhesive unit AD4*a* may be equal to or lower than the adhesive force of the second adhesive unit AD4*b*.

The second adhesive unit AD4*b* is disposed in the fourth adhesive layer AD4 so as to enclose the first adhesive unit AD4*a*. The second adhesive unit AD4*b* may be a remaining part of the fourth adhesive layer AD4 in which the first adhesive unit AD4*a* is not disposed. At this time, the second adhesive unit AD4*b* is disposed to be separated from the first adhesive unit AD4*a*. As an example, the first adhesive unit AD4*a* and the second adhesive unit AD4*b* are disposed as separate configurations and there may be an interface between the first adhesive unit AD4*a* and the second adhesive unit AD4*b*, but are not limited thereto. As an example, side surfaces of the first adhesive unit AD4*a* and the second adhesive unit AD4*b* may contact with each other.

The second adhesive unit AD4*b* has a conductivity lower than that of the first adhesive unit AD4*a*. For example, the second adhesive unit AD4*b* may be formed of a pressure sensitive adhesive (PSA), but is not limited thereto.

In a display device in which a through-hole for forming an optical area for disposing a camera and/or a sensor in the display area is disposed, there may be a problem in that a current is concentrated on the outer periphery of the through-hole during the driving of the display device, due to the static electricity. At this time, the current concentrated in the through-hole flows into the display panel to cause the defect of the display element and the circuit element and degrade an image quality of the display device.

Therefore, in the display device in which an optical area is disposed in the display area, the cover glass and/or the metal plate are earthed to remove the current concentrated on the outer periphery of the through-hole during the driving of the display device. At this time, in order to electrically connect the cover glass and the metal plate, for example, a conductive tape may be used or a conductive ink may be applied.

However, when the conductive tape or the conductive ink is used, a space for attaching the tape or applying the conductive ink is required on the rear surface of the cover glass so that it is difficult to ensure a narrow bezel for an optical area which is a non-display area.

Further, the conductive tape may have an adhesive defect due to the reduced lifespan so that there is an additional problem in that quality control is difficult. Further, the conductive ink is fluid so that there are additional problems in that the conductive ink is irregularly applied to degrade an outer appearance quality, or the concentrated current is not removed due to the area in which the conductive ink is not applied.

Therefore, in the display device 100 according to the exemplary embodiment of the present disclosure, the fourth adhesive layer AD4 includes a first adhesive unit AD4*a* which encloses the through-hole TH and a second adhesive unit AD4*b* which encloses the first adhesive unit AD4*a*. The degradation of the reliability of the display device 100 caused by the current concentrated on the outer periphery of the through-hole TH flowing into the display panel 110 during the driving of the display device 100 may be minimized or reduced.

Specifically, the fourth adhesive layer AD4 is disposed between the back plate 130 and the metal plate 140 to bond between the back plate 130 and the metal plate 140. The first adhesive unit AD4*a* is disposed in a part of the fourth adhesive layer AD4 which encloses the through-hole TH in the plan view (e.g., with a constant width) and the second adhesive unit AD4*b* is disposed in a remaining part. At this time, the first adhesive unit AD4*a* has a conductivity so that a current concentrated on the outer periphery of the through-hole TH during the driving of the display device 100 may be induced to move toward the metal plate 140 disposed on the first adhesive unit AD4*a*. For example, when the display device 100 is driven, the current may be concentrated in a part corresponding to the through-hole TH, that is, a side surface of the polarizer POL, a side surface of the display panel 110, and a side surface of the back plate 130 in which the through-hole TH is disposed. At this time, the first adhesive unit AD4*a* having a conductivity is disposed in the fourth adhesive layer AD4 disposed between the back plate 130 and the metal plate 140 while enclosing the through-hole TH. Therefore, the first adhesive unit AD4*a* has a conductivity to induce current concentrated on the side surface of the polarizer POL, the side surface of the display panel 110, and the side surface of the back plate 130 in which the through-hole TH is disposed to move to the first adhesive unit AD4*a*. Further, the current which moves to the first adhesive unit AD4*a* may move to the metal plate 140 which is in contact with the first adhesive unit AD4*a*. At this time, the current which moves to the metal plate 140 moves to a frame which is configured to earth the metal plate 140 so that the current may be removed without being concentrated on the through-hole TH, but is not limited thereto. Accordingly, in the display device 100 according to the exemplary embodiment of the present disclosure, the fourth adhesive layer AD4 includes a first adhesive unit AD4*a* which encloses the through-hole TH and a second adhesive unit AD4*b* which encloses the first adhesive unit AD4*a*. Therefore, the current concentrated on the outer periphery of the through-hole TH during the driving of the display device 100 may be reduced or removed. Further, the degradation of the reliability of the display device 100 which is caused by the current which is concentrated on the outer periphery of the through-hole TH during the driving of the display device 100 to flow into the display panel 110 may be reduced or minimized.

Further, in the display device 100 according to the exemplary embodiment of the present disclosure, the fourth adhesive layer AD4 includes a first adhesive unit AD4*a* which encloses the through-hole TH and a second adhesive unit AD4*b* which encloses the first adhesive unit AD4*a*. Therefore, a configuration for inducing the current concentrated on the outer periphery of the through-hole TH may not be disposed in the through-hole TH. Therefore, a narrow bezel for the optical area OA is possible.

Specifically, in the display device 100 according to the exemplary embodiment of the present disclosure, the first adhesive unit AD4*a* which is a configuration of inducing the current concentrated on the outer periphery of the through-hole TH is included in the fourth adhesive layer AD4. That is, a separate configuration for inducing the current concentrated on the outer periphery of the through-hole TH may not be disposed in the through-hole TH. Therefore, the size of the through-hole TH which configures the optical area OA may be reduced or minimized and the size of the optical area is reduced or minimized so that the area of the display area which is contracted in accordance with the placement of the optical area, that is, a size of the bezel area may be reduced or minimized. Accordingly, in the display device 100 according to the exemplary embodiment of the present disclosure, the fourth adhesive layer AD4 includes a first adhesive unit AD4*a* which encloses the through-hole TH and a second adhesive unit AD4*b* which encloses the first adhesive unit AD4*a*. Therefore, a configuration for inducing the current concentrated on the outer periphery of the through-hole TH may not be disposed in the through-hole TH so that a narrow bezel for the optical area OA is possible.

Figure 4:
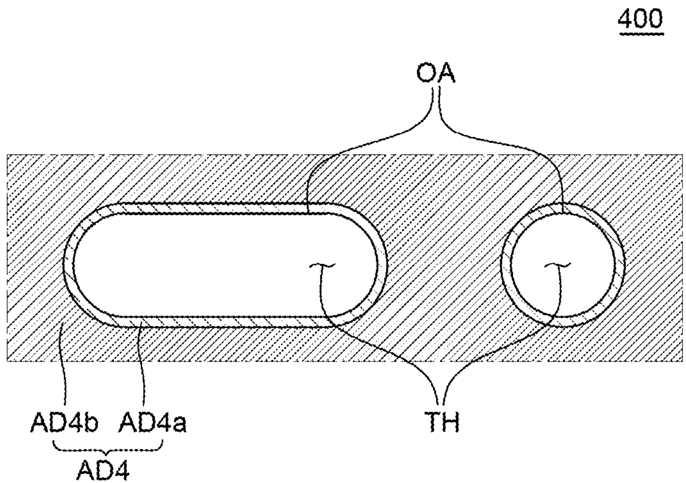
FIG. 4 is an enlarged plan view of a display device according to an exemplary embodiment of the present disclosure.

FIG. 4 is an enlarged plan view of a display device according to an exemplary embodiment of the present disclosure. The only difference between a display device 400 of FIG. 4 and the display device 100 of FIGS. 1 to 3 is a material of the first adhesive unit AD4*a*, but the other configuration is the same, so that a redundant description will be briefly given or omitted. In the meantime, for the convenience of description, in FIG. 4, only a fourth adhesive layer AD4 is illustrated.

In the display device 400 according to another exemplary embodiment of the present disclosure, a reflectance of the first adhesive unit AD4*a* may be equal to a reflectance of the second adhesive unit AD4*b*. Here, when the reflectance of the first adhesive unit AD4*a* is equal to a reflectance of the second adhesive unit AD4*b*, it not only means that the reflectance of the first adhesive unit AD4*a* and the reflectance of the second adhesive unit AD4*b* are perfectly equal, but also means that the difference of the reflectance of the first adhesive unit AD4*a* and the reflectance of the second adhesive unit AD4*b* is included in an error range of 10% or lower, or 5% or lower.

The first adhesive unit AD4*a* has the same reflectance as the second adhesive unit AD4*b* so that the reflection characteristic is reduced or minimized. For example, when a thickness of the first adhesive unit AD4*a* is 550 nm, the reflectance of the first adhesive unit AD4*a* is lower than 4.5 and when a thickness of the first adhesive unit AD4*a* is 1380 nm, the reflectance of the first adhesive unit AD4*a* is lower than 4.6, but it is not limited thereto. As an example, the first adhesive unit AD4*a* and the second adhesive unit AD4*b* have the same thickness, without being limited thereto.

Specifically, in order to give the conductivity to the first adhesive unit AD4*a*, for example, a material having a high reflectivity, such as a metal material, may be added. At this time, in the optical area OA in which the first adhesive unit AD4*a* is disposed, external light reflection by the component of the display device is generated through the through-hole TH so that a display quality may be degraded. Accordingly, the display device 400 according to another exemplary embodiment of the present disclosure is configured such that the first adhesive unit AD4*a* has the same reflectance as the second adhesive unit AD4*b* and the reflective characteristic is reduced or minimized. Therefore, the external light reflection of the optical area may be reduced or minimized, and the display quality of the display device may be improved.

Figure 5A:
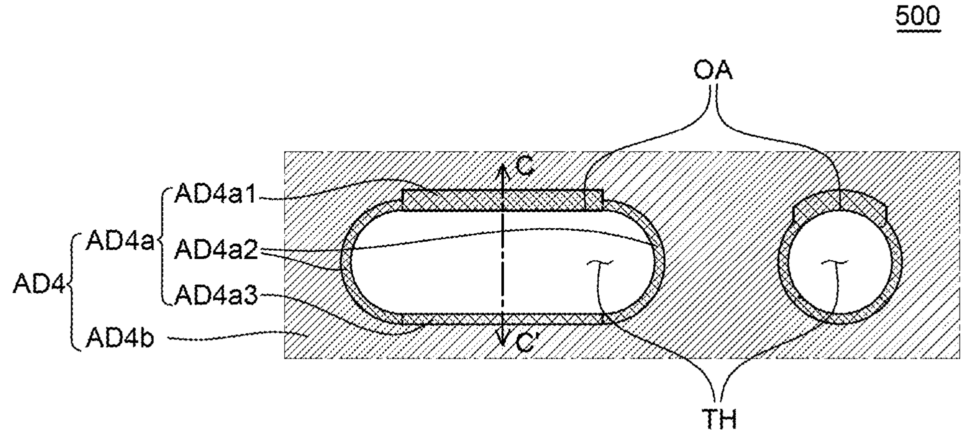
FIG. 5A is an enlarged plan view of a display device according to still another exemplary embodiment of the present disclosure.
Figure 5B:
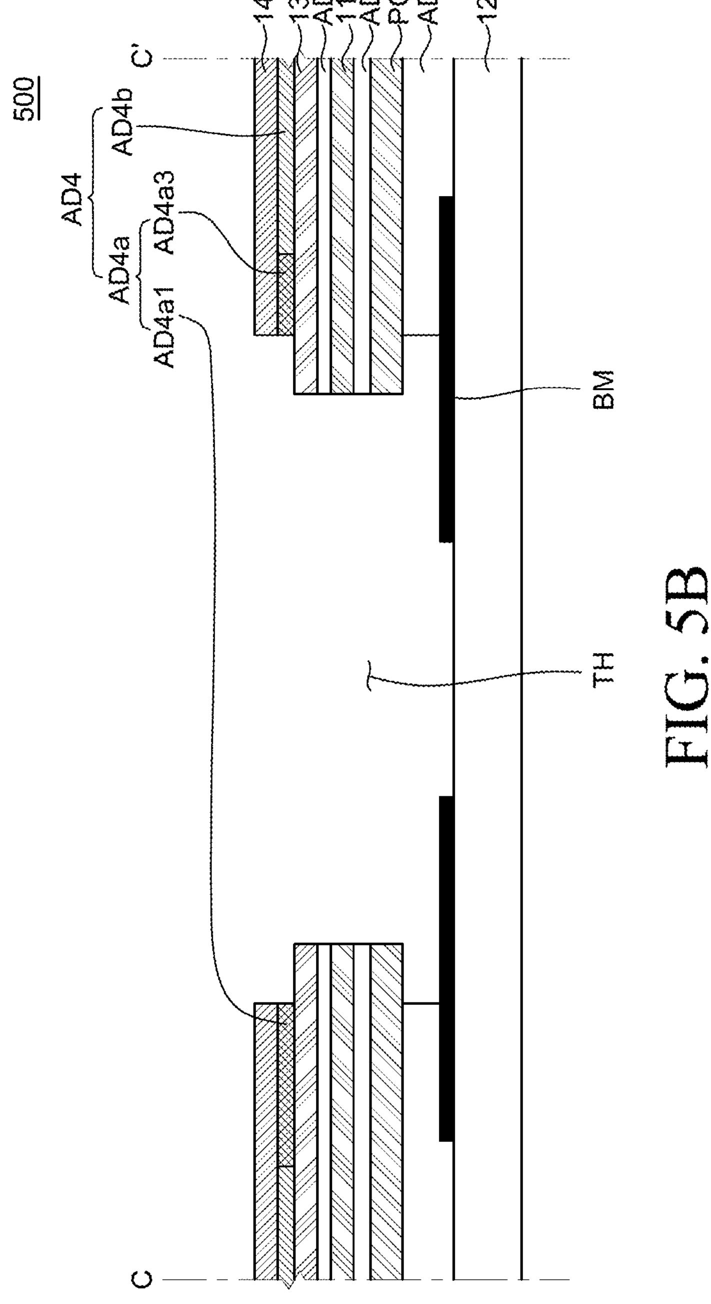
FIG. 5B is a cross-sectional view of a display device according to still another exemplary embodiment of the present disclosure.

FIG. 5A is an enlarged plan view of a display device according to still another exemplary embodiment of the present disclosure. FIG. 5B is a cross-sectional view of a display device according to still another exemplary embodiment of the present disclosure. The only difference between a display device 500 of FIGS. 5A and 5B and the display device 100 of FIGS. 1 to 3 is a shape of the first adhesive unit AD4*a*, but the other configuration is the same, so that a redundant description will be omitted or briefly given. In the meantime, for the convenience of description, in FIG. 5A, only a fourth adhesive layer AD4 is illustrated.

Referring to FIGS. 5A and 5B, the first adhesive unit AD4*a* includes a first part AD4*a*1, a plurality of second parts AD4*a*2, and a third part AD4*a*3.

As an example, the first part AD4*a*1 may be adjacent to one end of the display device 500 which is disposed to be adjacent to the optical area OA in the plan view, without being limited thereto. In the plan view, a width of the first part AD4*a*1 may be larger than a width of the plurality of second parts AD4*a*2 and the third part AD4*a*3. As an example, a width of a portion of the first adhesive unit AD4*a* adjacent to one end of the display device 500 disposed to be adjacent to the optical area OA in the plan view may be larger. Embodiments are not limited thereto. As an example, one or more portions of the first adhesive unit AD4*a* may have a larger width than the remaining portion of the first adhesive unit AD4*a*, irrespective of the end of the display device 500, without being limited thereto.

The plurality of second parts AD4*a*2 is connected to the first part AD4*a*1 and extends from the first part AD4*a*1. The plurality of second parts AD4*a*2 may be disposed on both sides of the optical area OA. In the plan view, widths of the plurality of second parts AD4*a*2 are smaller than a width of the first part AD4*a*1. In the plan view, the widths of the plurality of second parts AD4*a*2 may be constant, without being limited thereto. As an example, there may be step portions at interfaces between the second parts AD4*a*2 and the first part AD4*a*1 on an outer perimeter of the first adhesive unit AD4*a*. As an example, the first adhesive unit AD4*a* may have continuous inner perimeter.

The third part AD4*a*3 is connected to the plurality of second parts AD4*a*2 and extends from the plurality of second parts AD4*a*2. The third part AD4*a*3 may be disposed to be opposite to the first part AD4*a*1 with the through-hole TH therebetween. The third part AD4*a*3 is relatively farther from one end of the display device 500 which is disposed to be adjacent to the optical area OA. In the plan view, a width of the third part AD4*a*3 may be smaller than a width of the first part AD4*a*1. In the plan view, the width of the third part AD4*a*3 may be constant, without being limited thereto.

In the optical area, defects of the components of the display device may be visible through the through-hole. Specifically, a part of the optical area which is adjacent to one end of the display device corresponds to an outer periphery which is far from a center of the display device. Therefore, in the part of the optical area adjacent to one end of the display device, an area in which the defect is visible may be larger than a part of the optical area which is far from the end of the display device 500, due to the difference of the viewing angle from the user.

Therefore, in the display device 500 according to still another exemplary embodiment of the present disclosure, a width of the first part AD4*a*1 is larger than widths of the plurality of second parts AD4*a*2 and the third part AD4*a*3 in the plan view. Therefore, the current concentration in the optical area OA adjacent to one end of the display device 500 which has a larger defect recognition area and is more vulnerable to defect recognition may be further reduced or minimized. Accordingly, the display quality may be improved by reducing or minimizing the visible recognition of the defect caused by the current which is concentrated on the outer periphery of the through-hole TH during the driving of the display device 500 to flow into the display panel 110, from the outside of the display device 500.

Figure 6:
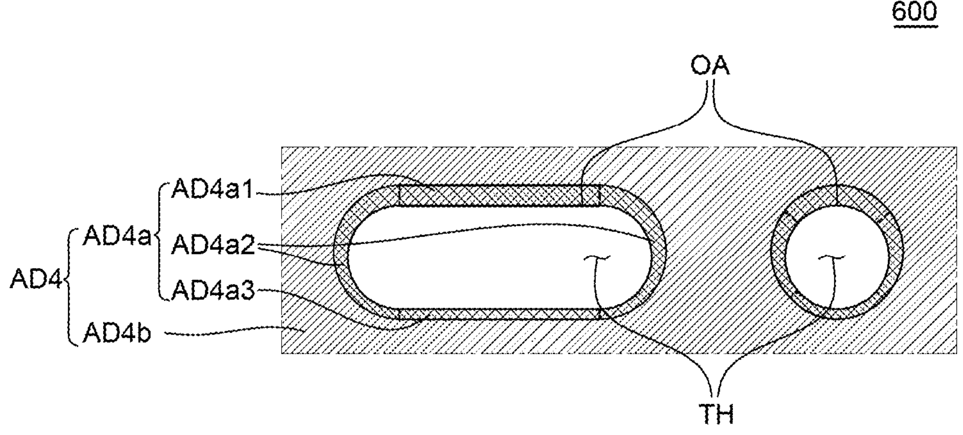
FIG. 6 is an enlarged plan view of a display device according to still another exemplary embodiment of the present disclosure.

FIG. 6 is an enlarged plan view of a display device according to still another exemplary embodiment of the present disclosure. The only difference between a display device 600 of FIG. 6 and the display device 100 of FIGS. 1 to 3 is a shape of the first adhesive unit AD4*a*, but the other configuration is the same, so that a redundant description will be omitted or briefly given. In the meantime, for the convenience of description, in FIG. 6, only a fourth adhesive layer AD4 is illustrated.

Referring to FIG. 6, a width of a plurality of second parts AD4*a*2 disposed along the through-hole TH in the plan view is reduced as it is away from the first part AD4*a*1 and closer to the third part AD4*a*3. Further, in the plan view, a width of the first part AD4*a*1 may be larger than widths of the plurality of second parts AD4*a*2 and the third part AD4*a*3. That is, a width of a portion of the first adhesive unit AD4*a* adjacent to one end of the display device 600 disposed to be adjacent to the optical area OA in the plan view may be larger. As an example, a width of the second parts AD4*a*2 may be the same as the width of the first part AD4*a*1 at interfaces between the second parts AD4*a*2 and the first part AD4*a*1, and may be the same as the width of the third part AD4*a*3 at interfaces between the second parts AD4*a*2 and the third part AD4*a*3, without being limited thereto. As an example, the first adhesive unit AD4*a* may have a continuous inner perimeter and a continuous outer perimeter, without being limited thereto. As an example, the width of the second parts AD4*a*2 may be gradually varied from the first part AD4*a*1 to the third part AD4*a*3. As an example, the width of the second parts AD4*a*2 may be gradually varied from the width of the first part AD4*a*1 to the width of the third part AD4*a*3, without being limited thereto.

In the display device 600 according to still another exemplary embodiment of the present disclosure, a width of the first part AD4*a*1 is larger than widths of the plurality of second parts AD4*a*2 and the third part AD4*a*3 in the plan view. Therefore, the current concentration in the optical area OA adjacent to one end of the display device 600 which has a larger defect recognition area and is more vulnerable to defect recognition may be further reduced or minimized. Accordingly, the display quality may be improved by reducing or minimizing the visible recognition of the defect caused by the current which is concentrated on the outer periphery of the through-hole TH during the driving of the display device 600 to flow into the display panel 110, from the outside of the display device 600.

The exemplary embodiments of the present disclosure can also be described as follows:

According to an aspect of the present disclosure, a display device includes a cover window; a display panel which is disposed below the cover window and includes a display area in which a plurality of sub pixels is disposed and an optical area which is disposed between the plurality of sub pixels in the display area and has a through-hole disposed therein; an adhesive layer which is disposed below the display panel and includes a first adhesive unit which is disposed to enclose the through-hole and has a conductivity and a second adhesive unit which encloses the first adhesive unit; and a metal plate disposed below the adhesive layer.

The through-hole may expose a side surface of the display panel, a side surface of the first adhesive unit, and a side surface of the metal plate which overlap the optical area.

The first adhesive unit and the second adhesive unit may be disposed to be separated from each other.

The first adhesive unit may have a conductivity higher than that of the second adhesive unit.

A reflectance of the first adhesive unit may be equal to a reflectance of the second adhesive unit.

A reflectance of the first adhesive unit may be lower than 4.6.

The first adhesive unit may be disposed so as to enclose the through-hole in the plan view with a constant width.

The first adhesive unit may include a first part which is adjacent to one end of the display device, a plurality of second parts extending from the first part, and a third part which extends from the plurality of second parts and is opposite to the first part with the through-hole therebetween.

A width of the first part may be larger than a width of the third part in the plan view.

Widths of the plurality of second parts disposed along the through-hole may be constant in the plan view.

Widths of the plurality of second parts disposed along the through-hole may be reduced as it is adjacent from the first part to the third part in the plan view.

The display device may further comprise a back plate disposed between the display panel and the adhesive layer.

The through-hole may expose a side surface of the display panel, a side surface of the back plate, a side surface of the first adhesive unit, and a side surface of the metal plate which overlap the optical area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the claims is not limited by the disclosure, and all the technical concepts in the equivalent scope thereof should be construed as falling within the scope of the present disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a display panel, including:
a display area;
a plurality of sub pixels disposed in the display area; and
a through-hole between the plurality of sub pixels in the display area;
an adhesive layer disposed below the display panel and including a first adhesive member which is disposed to enclose the through-hole and has a conductivity and a second adhesive member which encloses the first adhesive member; and
a metal plate disposed below the adhesive layer.

2. The display device according to claim 1, wherein the through-hole exposes a side surface of the display panel, a side surface of the first adhesive member, and a side surface of the metal plate.

3. The display device according to claim 1, wherein the first adhesive member and the second adhesive member are separate layers of the adhesive layer.

4. The display device according to claim 1, wherein the first adhesive member and the second adhesive member are in contact with each other.

5. The display device according to claim 1, wherein the conductivity of the first adhesive member is greater than a conductivity of the second adhesive member.

6. The display device according to claim 1, wherein a reflectance of the first adhesive member is equal to a reflectance of the second adhesive member.

7. The display device according to claim 5, wherein a reflectance of the first adhesive member is lower than 4.6.

8. The display device according to claim 1, wherein the first adhesive member is disposed so as to enclose the through-hole in a plan view with a constant width.

9. A display device, comprising:
a display panel, including:
a display area;
a plurality of sub pixels disposed in the display area; and
a through-hole between the plurality of sub pixels in the display area;
an adhesive layer disposed below the display panel and including a first adhesive member which is disposed to enclose the through-hole and has a conductivity and a second adhesive member which encloses the first adhesive member, wherein the first adhesive member includes:
a first part;
a plurality of second parts extending from the first part; and
a third part which extends from the plurality of second parts and is opposite to the first part with the through-hole therebetween, and
a width of the first part is greater than a width of the third part in a plan view; and
a metal plate disposed below the adhesive layer.

10. The display device according to claim 9, wherein the first part is adjacent to a first end of the display device that is adjacent to the through-hole.

11. The display device according to claim 9, wherein widths of the plurality of second parts disposed along the through-hole are constant in the plan view.

12. The display device according to claim 11, wherein the first adhesive member has step portions at interfaces between the first part and the plurality of second parts on an outer perimeter of the first adhesive member, and the first adhesive member has a continuous inner perimeter.

13. The display device according to claim 9, wherein widths of the plurality of second parts disposed along the through-hole reduce in a direction away from the first part and toward the third part in the plan view.

14. The display device according to claim 13, wherein widths of the plurality of second parts are the same as the width of the first part at interfaces between the plurality of second parts and the first part, and widths of the plurality of second parts are the same as the width of the third part at interfaces between the plurality of second parts and the third part.

15. The display device according to claim 1, further comprising:

a back plate disposed between the display panel and the adhesive layer, wherein the through-hole exposes a side surface of the display panel, a side surface of the back plate, a side surface of the first adhesive member, and a side surface of the metal plate.

16. A display device, comprising:

a display panel, including:

a display area;

a plurality of sub pixels disposed in the display area; and a through-hole between the plurality of sub pixels in the display area;

an adhesive layer disposed below the display panel and including a first adhesive member which is disposed to enclose the through-hole and has a conductivity and a second adhesive member which encloses the first adhesive member;

a metal plate disposed below the adhesive layer; and a cover window disposed above the display panel and overlapping the through-hole.

17. The display device according to claim 16, wherein the metal plate is grounded.

18. The display device according to claim 16, wherein the second adhesive member is an adhesive material, and the first adhesive member includes the adhesive material and a conductive material.

19. The display device according to claim 16, wherein an adhesive force of the first adhesive member is equal to or lower than an adhesive force of the second adhesive member.

20. The display device according to claim 16, further comprising an optical electronic device corresponding to the through-hole.

* * * * *